United States Patent [19]

Nishizawa et al.

[11] Patent Number: 4,871,417
[45] Date of Patent: Oct. 3, 1989

[54] METHOD AND APPARATUS FOR SURFACE TREATING OF SUBSTRATES

[75] Inventors: Hisao Nishizawa, Shiga; Masaru Morita, Minami; Masato Tanaka, Nagahama, all of Japan

[73] Assignee: Dainippon Screen Mfg. Co., Ltd., Kyoto, Japan

[21] Appl. No.: 69,541

[22] Filed: Jun. 30, 1987

[30] Foreign Application Priority Data

Jul. 4, 1986 [JP] Japan ................. 61-158497

[51] Int. Cl.$^4$ .............. H01L 21/306; B08B 3/10
[52] U.S. Cl. .................... 156/640; 156/662;
134/1; 134/21; 134/33; 134/149; 134/153; 134/155
[58] Field of Search ............... 156/345, 628, 640, 662;
134/1, 2, 18, 21, 26, 33, 149, 153, 154, 155;
118/730, 50, 50.1; 437/231

[56] References Cited

U.S. PATENT DOCUMENTS

| | | | |
|---|---|---|---|
| 3,041,225 | 6/1962 | Emeis | 134/153 X |
| 3,594,230 | 7/1971 | Kierner | 134/33 X |
| 3,990,462 | 11/1976 | Elftmann et al. | 134/102 |
| 4,028,135 | 6/1977 | Vig et al. | 134/1 |
| 4,183,780 | 1/1980 | McKenna et al. | 156/345 X |
| 4,510,176 | 4/1985 | Cuthbert et al. | 134/33 X |
| 4,591,485 | 5/1986 | Olsen et al. | 134/1 X |
| 4,682,614 | 7/1987 | Silvernail et al. | 134/154 X |

FOREIGN PATENT DOCUMENTS

| | | | |
|---|---|---|---|
| 52-67057 | 6/1977 | Japan | 134/153 |
| 54-22777 | 2/1979 | Japan | 156/640 |
| 55-115332 | 9/1980 | Japan | 134/153 |
| 60-249331 | 10/1985 | Japan . | |

Primary Examiner—David L. Lacey
Assistant Examiner—Andrew J. Anderson
Attorney, Agent, or Firm—Lowe, Price, LeBlanc, Becker & Shur

[57] ABSTRACT

A method for surface treating of thin substrates such as semiconductor wafers, wherein a semiconductor wafer formed with relatively deep but transversely minute trenches on its surface is horizontally placed on a spinner in a chamber with its trenched surface directed up, ultraviolet light is then emitted onto the surface of the wafer to dissolve impurities sticking in the trenches, and thereafter etchant is spouted from a nozzle to the trenched surface of the wafer being spinned about a vertical axis at a high speed. Next, the inside of the chamber is subjected to a lower pressure than atmospheric pressure, and atmospheric pressure is restored after the lapse of a predetermined time. Thus a series of these steps of etchant supplying, pressure reducing, and pressure recovering are carried out until the complete entrance of the etchant into the interior surfaces of the trenches is effected, so as to even or smooth the interior surfaces and, finally the wafer is treated with rinsing, heating and drying steps.

19 Claims, 4 Drawing Sheets

METHOD AND APPARATUS FOR SURFACE TREATING OF SUBSTRATES

FIELD OF THE INVENTION AND RELATED ART STATEMENTS

The present invention relates to method and apparatus for executing surface treating for thin substrates such as semiconductor wafers, wherein the substrates are treated with etching, rinsing, etc. on surfaces thereof while being spun.

Lately, attempts have been made to form substatially vertical trenches on and relative to main surfaces of the wafer, which are so deep and minute as to be over 5 $\mu$m in depth and less than 1 $\mu$m in opening width, by applying thereto dry etching and the like. This helps attain a high density of integrated circuits to be deposited on the wafer, since the trenches can be useful to the accomplishment of element separations and significant increase in the capacitance of capacitors required for the achievement of such high densely integrated circuits.

Heretofore, a sacrificial film has been made on the interior surfaces of the trenches thus formed on the wafer and then the wafer is subjected to a wet etching treatment to remove the film so that contaminants stuck on the interior surfaces can be removed along with the film and, simultaneously, internal stresses induced in the wafer around the trenches as a result of the dry etching application can be canceled. However, since the opening of the trench is extremely small in width and the trench, per se, is relatively deep as stated above, full entry of an etchant and a subsequent rinsing liquid into the trenches are difficult, and thus desirable surface treatments to the interior of the trench are not readily achieved.

Meanwhile, in conducting a rinsing treatment to the wafer, it is conventionally well known to immerse the semiconductor wafer into a rinsing bath and then to vibrate a rinsing liquid in the bath with a supersonic wave. In this connection, Japanese Patent Application Kokai No. 60-249331 discloses this type of rinsing technique which would seem most advantageous to the semiconductor wafer formed with the aforementioned trenches.

However, the technique will inevitably require the provision of many supersonic wave generators to effect the complete rinsing of the insides of the trenches on the wafer.

SUMMARY OF THE INVENTION

With a view to solving the above problems, it is an objective of the present invention to provide novel and improved method and apparatus for surface treating of substrates.

It is another objective of the invention to provide method and apparatus for surface treating of substrates, wherein the wet etching can be wholly applied to the interior surfaces of the deep and minute trenches formed on the surface of the substrate, and also the rinsing treatment of the trenches can be attained effectively or advantageously and further that these treatments can be conducted by means of a single installation.

In order to accomplish the above objectives, there is provided, according to an aspect of the invention, a method for surface treating of substrates which comprises the steps of horizontally setting a substrate which comprises the steps of horizontally setting a substrate on spinning means spinning about a vertical axis; supplying a treating liquid to a surface of the substrate being held for spinning by said spinning means in a chamber; thereafter varying a pressure of the inside of the chamber; and repeating a series of the supplying and varying steps a necessary number of times.

In a preferred embodiment, the method comprises the additional step of emitting ultraviolet light to the surface of the substrate, and this emitting step is conducted ahead of the supplying step.

In another preferred embodiment, the supplying step is carried out together with the emitting step.

In a further preferred embodiment, the varying step includes rendering the inside of the chamber at a lower pressure than atmospheric pressure and thereafter recovering the atmospheric pressure.

Preferably, the method comprises the additional step of heating and drying the substrate by emitting light to the surface thereof, and this heating and drying step is conducted together with the rendering and recovering.

Still preferably, the varying step includes rendering the inside of the chamber at a higher pressure than atmospheric pressure and thereafter recovering the atmospheric pressure.

Moreover, there is provided, according to another aspect of the invention, an apparatus for surface treating of substrates which comprises a chamber; spinning means provided within the chamber for horizontally holding a substrate thereon and spinning the substrate about a vertical axis; nozzle means for supplying treating liquids to a surface of the substrate on the spinning means; and means for varying a pressure of the inside of the chamber.

In a preferred embodiment, the varying means includes means for reducing the pressure of the inside of the chamber, and there is provided a shield member in the chamber for shielding that portion of the chamber, and also portions surrounding the former, which insertingly receives a spinning shaft of the spinning means, and on a portion of the chamber shielded by the shield member there is formed a drain mouth communicated with the reducing means.

In another preferred embodiment, the apparatus further comprises a light source inside or outside of the chamber for heating and drying the substrate in the spinning means.

In yet another preferred embodiment, the apparatus further comprises a light source inside or outside of the chamber for emitting ultraviolet light.

Thus, according to the invention, there can be wholly effected the wet etching of the entire interior surfaces of the deep and minute trenches formed on the surface of the substrate being treated, so as to enable the evening or smoothing of the interior surfaces, and the rinsing of the trenches can be achieved most effectively or advantageously. Moreover, these etching and rinsing treatments can be executed by means of a single installation.

The foregoing and other objectives and attendant advantages of the present invention will be readily appreciated as the same become better understood by reference to the following detailed description when considered with the accompanying drawings,

DETAILED DESCRIPTION OF THE PREFERRED EMBODIMENTS

Figure 1:
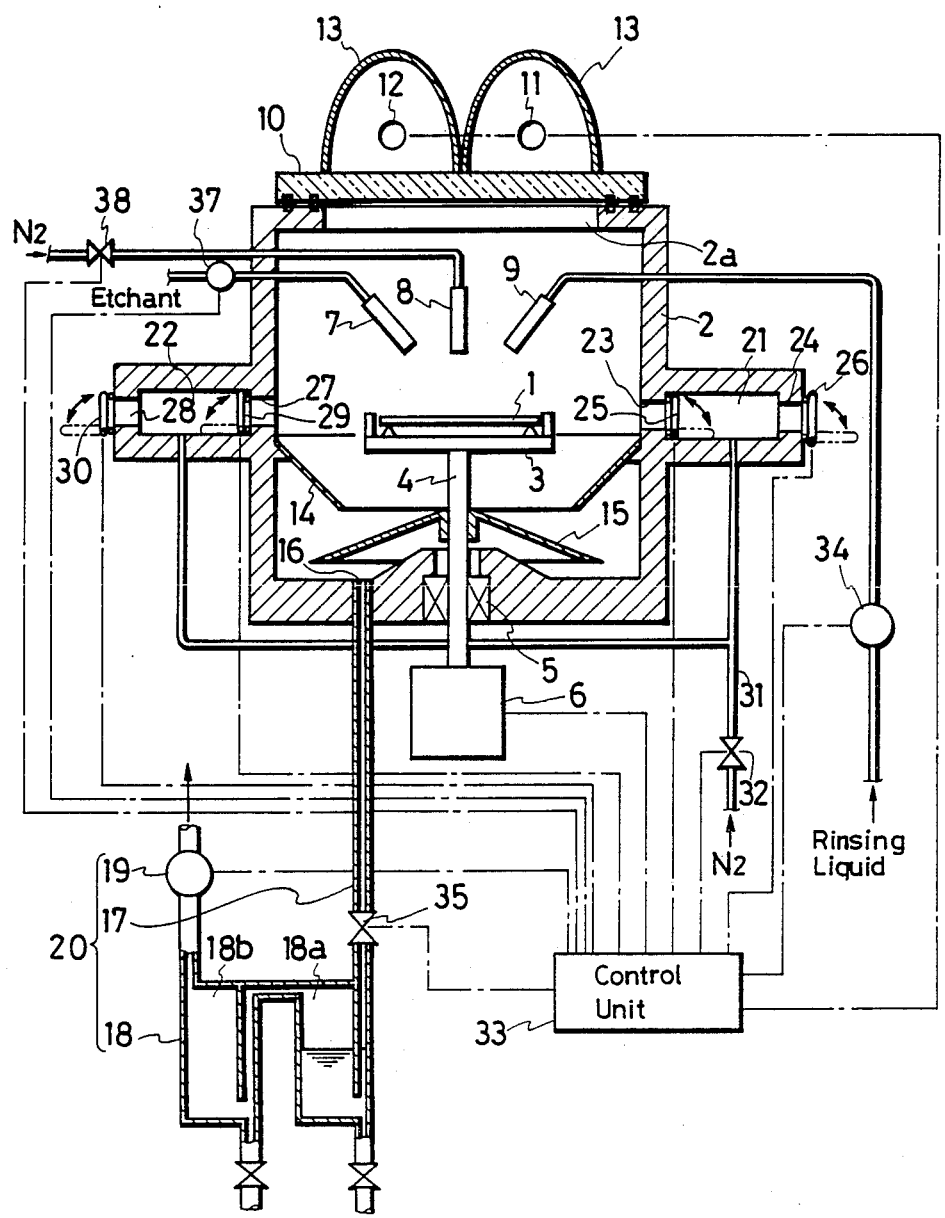
FIG. 1 is a schematic vertical sectional view illustrating the apparatus for surface treating of substrates according to a preferred embodiment of the invention.

Now referring to the drawings, there are described below preferred embodiments of the invention.

Figure 2A:
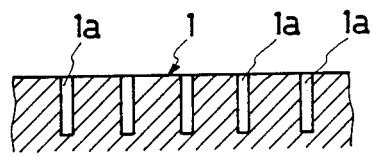
FIGS. 2A through 2E are enlarged sectional views schematically depicting the procedure of surface treating of a semiconductor wafer executed by the apparatus of FIG. 1.

FIG. 1 is a schematic vertical sectional view of the apparatus for surface treating of substrates of an embodiment according to the invention. The apparatus is employed for surface treating of a semiconductor wafer 1 formed with deep and minute trenches 1a on a surface thereof as shown in FIG. 2A, by the use of etchant, rinsing liquid, etc.. Substantially on the center of a chamber 2 in the shape of a box, there is disposed a table-shaped spinner 3 for holding the wafer 1 horizontally. To a central bottom of the spinner 3 is connected a spinning shaft 4, which is spinningly supported by a bearing 5 at the bottom of the chamber 2 and is, extending through the bottom, connected to a motor 6 outside of the chamber. Upward of the spinner 3 in the chamber 2 there are provided nozzles 7, 8, and 9 for spouting etchant, nitrogen gas, and a rinsing liquid against the trenched surface of the wafer respectively.

On the ceiling of the chamber 2 is formed an opening 2a which is airtightly covered with a light-permeable lid 10 made of quartz. Upward of the lid 10 there are provided heating and drying light source 11 such as a halogen lamp or the like and ultraviolet radiation light source 12 respectively. Moreover, there are provided dome-shaped reflectors 13 upward of the light sources 11 and 12 in a manner to cover them, so as to attain the effective light-emission and projection from the sources to the inside of the chamber 2 through the lid 10. Further, along the entire circumference of that portion of the inner wall of the chamber which occupies a slightly lower position than the spinner 3 within the chamber, there is provided an upwardly opened reflector 14 in the shape of an inverted umbrella.

Meanwhile, in order to cover that portion of the chamber bottom, and also portions surrounding the former, which insertingly receives the spinning shaft 4 extending downward therefrom, there is disposed a shield 15 in the middle of the shaft 4, which is formed in the shape of an umbrella for that purpose. There is formed a drain mouth 16 for collectively discharging the etchant, nitrogen gas, and rinsing liquid jetted from the nozzles 7, 8, and 9, on that portion of the shield-covered bottom which is somewhat lower than the shaft receiving portion. Besides, another reflecting member may be provided to cover the upper surface of the shield 15 for the purpose of enhancing the work efficiency of the light sources 11 and 12. The mouth 16 is communicated with a trap 18 through a drain pipe 17. The trap 18 is divided into first and second parts 18a and 18b. The second part 18b is connected to a vacuum pump 19 of which sucking action through the pipe 17 and the trap 18 enables the pressure reduction of the inside of the chamber 2. Thus, drain pipe 17, trap 18, and vacuum pump 19 constitute pressure reduction means 20 altogether.

On opposite inner side wall portions of the chamber 2 across the spinner 3, there are formed passages 21 and 22 for carrying the wafers into and out of the chamber.

The passage 21 is communicated with the inside of the chamber 2 via an opening 23 and also communicated with the outside thereof through an opening 24. The openings 23 and 24 are closed by sealing doors 25 and 26 respectively. In the meantime, the passage 22 is communicated with the inside of the chamber via an opening 27 and also communicated with the outside thereof through an opening 28. The openings 27 and 28 are similarly closed by sealing doors 29 and 30.

The passages 21 and 22 are connected with a nitrogen gas supply source (not shown) through a pipe 31 and a valve 32. Opening and closing movements of the valve 32 are controlled by a control unit 33 composed of a computor and the like, of which controlling action permits the supply of nitrogen gas into the passages 21 and 22 if necessary. Furthermore, the unit 33 is adapted to assume the following controls of: driving and stopping of the motor 6 for spinning the spinner 3; etchant supply from the pump 37 into the nozzle 7; nitrogen gas supply from its source into the nozzle 8 through a valve 38; rinsing liquid supply of a pump 34 into the nozzle 9; opening and closing movements of a valve 35 that is provided on the drain pipe 17; lighting and and extinguishing movements of the light sources 11 and 12; and opening and closing of the sealing doors 25, 26, 29, and 30.

Figure 3A:
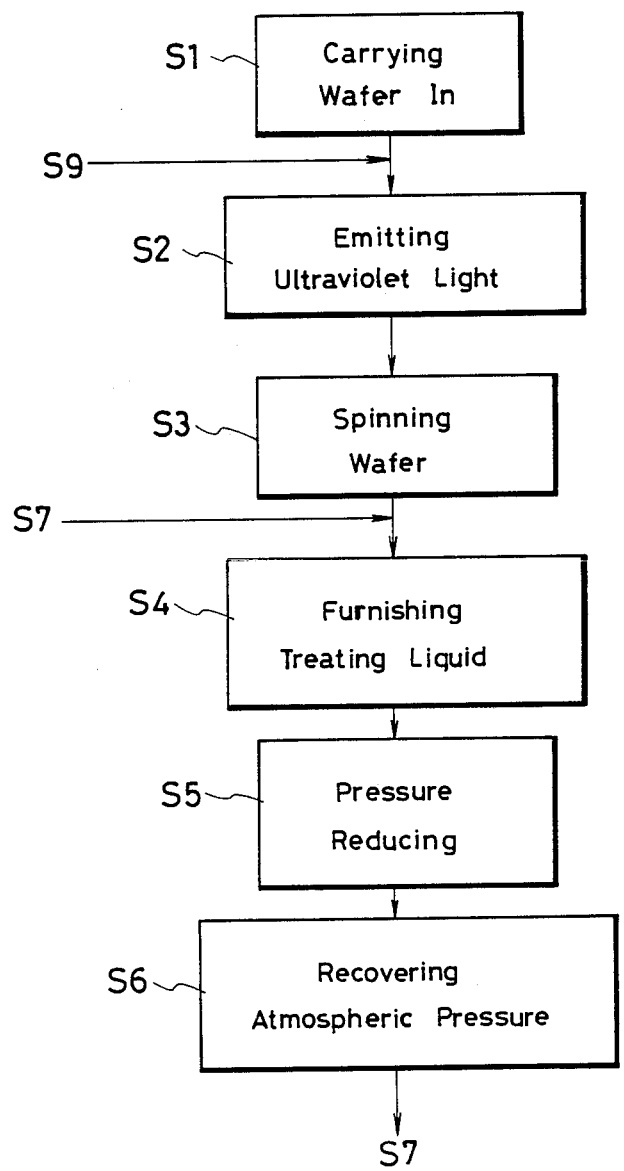
FIG. 3A and 3B are flowcharts illustrating the surface treating procedure.
Figure 3B:
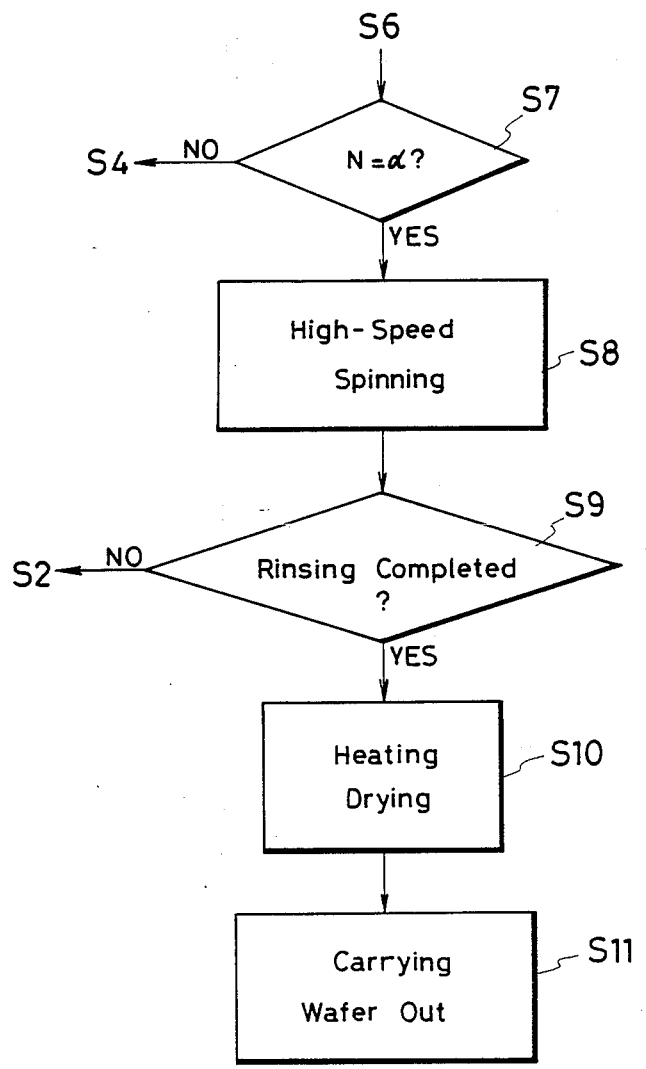

Described hereunder are procedures of the subject etching and rising treatments and the like applied to the trenched surface of the semiconductor wafer 1 using the apparatus of which elements and also motions and functions thereof have been explained above, with reference to a flowchart illustrating a control program of FIGS. 3A and 3B to be inputted to the aforementioned control unit 3.

In step S1, by commands given from the control unit 33 in accordance with the program inputted thereto beforehand, the sealing doors 25 and 26 are opened in the first place and then the semiconductor wafer 1 is transported into the chamber 2 through the passage 21 by transporting means (not shown), so that the wafer 1 is horizontally placed on the spinner 3. Prior to such transportation into the chamber, a dry etching processing or the like is applied to the semiconductor wafer 1 in order to form a number of deep and minute trenches with the wafer on its surface as depicted in FIG. 2A. Accordingly, the wafer 1 is set on the spinner with its trenched surface directed upward.

In step S2, ultraviolet light is emitted to the surface of the semiconductor wafer 1 from the light source 12 after the doors 25 and 26 are closed, so as to disolve impurities, such as valence-bonded fluoride, remaining in the interior surfaces of the trenches. Thus activation of the interior surfaces of the trenches 1a can thus be effected.

Thereafter, in step S3 the motor 6 is driven to rotate the spinner 3 at a predetermined speed, e.g. a few hundred revolutions per minute. In step S4, the etchant as a surface treating liquid 36 is spouted from the nozzle 7 against the trenched surface of the wafer 1 being spinned. However, since an opening of the trench 1a formed on the surface of the semiconductor wafer is so small in width as to be less than 1 μm and the depth of the trench 1a per se is so great as to be over 5 μm, entrance of the etchant thereinto will not readily take place. Besides, it is preferable that such spouting of the etchant be directed toward the spinning center of the wafer 1, because centrifugal force caused by the spinning motion will assure the uniform scattering of the etchant over the entire surface of the wafer.

In step S5, the pressure reduction means 20 is actuated. Specifically, the valve 35 of the drain pipe 17 is opened and the vacuum pump 19 is driven, so that gas in the chamber 2 is sucked into the trap 18 through the drain mouth 16 and the pipe 17. Thus pressure reduction of the inside of the chamber 2 is effected. Such gas-sucking causes the etchant that has drifted into the chamber bottom to be collectively discharged into the trap 18 via the pipe. Air existing at atmospheric pressure within the trenches 1a is so expanded as a result of the above pressure reduction as to break off the surface treating liquid 36 layer, i.e., the etchant covering the trenched surface of the wafer 1 and to further diffuse outward of the trenches, thereby permitting the etchant to partially enter into the air-free trenches in place of the air that leaves.

The pressure-reducing step is conducted for a predetermined time until a desired degree of vacuum is attained. In case the air outside drifts into the chamber 2 from the side of the bearing 5 during the execution of this step, any dust produced in the bearing mounting portion of the chamber will be carried thereinto by the drifting air. However, because of the portion insertingly receiving the spinning shaft and also the portions surrounding the former, such dust will be prevented from traveling up to the wafer 1. On the contrary, the dust will be introduced horizontally into the drain mouth 16 by the shield 15 and further discharged into the trap 18 through the drain pipe 17. Accordingly, it is preferable that the mouth be designed to be formed as closely as possible to the portion that insertingly receives the shaft 4, in view of the drifting motion of the outside air that carries the dust. In addition, this pressure-reducing step includes supplying nitrogen gas (or other inert gas) into the passages 21 and 22 repeatedly after the valve 32 is opened, in order to inhibit outside air from drifting into the chamber. Besides, pressure reduction may be applied to the inside of the passages 21 and 22 instead of a supply of the inert gas thereinto.

In step S6, the control unit 33 stops the execution of the pressure reduction after the lapse of a predetermined time from the start thereof and nitrogen gas (or any other clean gas such as inert gas) is furnished into the chamber 2 to render the inside thereof at atmospheric pressure. The pressure of the gas remaining in the trenches 1a and having undergone the pressure reduction is lower than that of the gas existing in the inside of the chamber that has the atmospheric pressure thus recovered, and hence the complete entrance of the treating liquid 36 i.e. the etchant into the trench 1a is effected as depicted in FIG. 2C.

An entrance quantity of the etchant into the trench 1a is equal to at least an escape quantity of the air from within the inside of the trench as a result of the expansion thereof caused by the pressure reduction. When, for example, the inside of the chamber is subjected to pressure reduction to one tenth of the atmospheric pressure, the air in the trench 1a expands in volume ten times, and accordingly approximately nine-tenths of the expanding air escapes therefrom and only a one-tenth thereof remains therewithin. Consequently, when the atmospheric pressure is restored in the inside of the chamber, the a quantity of the etchant equal to that of approximately nine-tenths of the expanding air, namely, equal to that of the air having escaped from within of the trenches 1a, enters thereinto to replace the same.

Since the interior surface of the trench 1a has been fully activated by the absorption of the ultraviolet radiation, the etchant can quite readily enter into the trenches 1a all the more. Furthermore, since the etchant is readily acceptable to the interior surface of the trench, the reaction of the etchant with the trench surface can take place effectively.

After the lapse of a predetermined time from the start of step S6 is conducted the next step S7 in which there is made a judgment by the control unit 33 as to whether or not $\alpha$ is reached by N after value one is added to N, where $\alpha$ is a value set for the repetition number of a series of steps S4–S7 (at least once, more, e.g., three times, if necessary) and N is an actually counted value therefor. When $\alpha$ is reached, a next step S8 follows, whereas the procedure is returned to step S4 when such is not the case and, thereafter, the series of steps S4–S7 is repeated predetermined times in order that there is achieved a complete entrance of the etchant into the trenches 1a on the wafer 1. Thus the interior surfaces of the trenches can be treated with etching in the entirety of their surfaces, so as to be rendered even or flat.

Besides, prior to pressure reducing, spinning the wafer 1 may follow, in order, furnishing the surface treating liquid 36 as occasion demands, although these two steps are carried out in reverse order in the foregoing. Furtheremore, supplying the liquid may continue during the execution of the pressure reduction(step S5). Yet further, the ultraviolet irradiation may be continually performed during the executions of steps S3–S6.

Figure 2B:
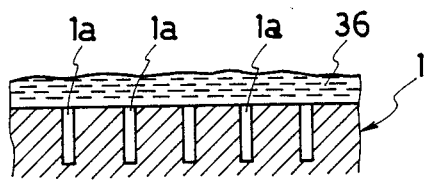
Figure 2C:
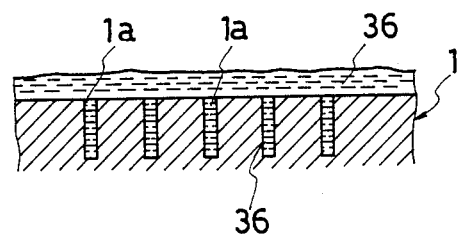
Figure 2D:
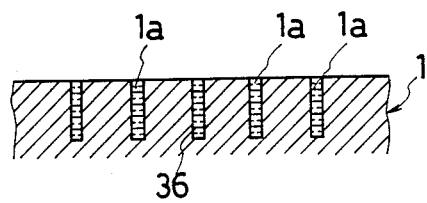

In step S8, the spinner 3 is spinned at a high speed, e.g. a few thousand revolutions per minute, whereby the etchant remaining on the surface of the wafer can be spatteringly removed therefrom by great centrifugal force, as illustrated in FIG. 2D. Thus the etching treatment of the wafer 1 is completed, thereafter succeeded by to the rinsing treatment therefor.

In step S9, before the rinsing treatment is carried out, a confirmation is made in advance as to whether or not the treatment is terminated. If the treatment is not completed needless to say, the procedure is returned to step S2, and just as in the case of etching treatment, the aforementioned steps S2–S8 are conducted based on the control unit 33, in which as the surface treating liquid 36 the etchant is however superseded by the rinsing liquid, such as pure water, to be spouted from the nozzle 9.

In the procedure of this rinsing treatment, the series of steps S4–S7 is also repeated the necessary number of times, so that the pure water can wholly enter into the bottoms of the individual trenches to effect complete rinsing of the interior thereof, as illustrated in FIGS. 2B and 2C. Besides, it is preferable that isopropylalcohol-(IPA) as for the surface treating liquid 36 be jetted from the nozzle 7 against the trenched surface of the wafer 1 to dispellingly substitute for the pure water thus entering into the bottoms of the trenches in step S4 of the last repeated series of steps S4–S7. It is moreover preferable that the ultraviolet light also be emitted to the surface of the wafer while the pure-water rinsing being executed, since the interior surfaces of the trenches 1a can be activated and hence impurities thereon will become susceptible of removal. On the contrary, the ultraviolet irradiation cannot be conducted in the case of IPA-rinsing preferably, because the alcohol component of IPA will be decomposed upon receipt of the ultraviolet light.

Figure 2E:
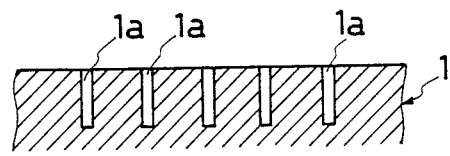

In step S9, the termination of the rinsing procedure is confirmed by the control unit 33, and is followed by step S10. In step S10, the light source 11 located upward of the chamber is actuated to emit light to the surface of the wafer 1 while the wafer is being spinned at a predetermined speed by driving the spinner 3. Preferably, the light source is selected to be one of a type emitting light having a wavelength substantially equal to the maximum absorption wavelength of the material of the wafer to be dried. For example, when the wafer is made of silicon the maximum absorption light for which is 1.2 $\mu$m, a halogen lamp, which emits chiefly light of 1-2 $\mu$m wavelengths, is suitably employed for the light source 11. Thus, the wafer 1 gradually becomes hot from its inside, so as to entirely evaporate the rinsing liquid such as any pure water and IPA remaining in the trenches 1a as depicted in FIG. 2E.

This drying step may be accompanied by pressure reduction of the inside of the chamber 2 to expedite the drying. Additionally, it is further preferable that the ultraviolet irradiation be performed together with the light emission from the light source 11 to promote dissolution or removal of the impurities that still remain in the trenches 1a. Thus the wafer being treated has undergone all the subject etching, rinsing, and drying treatments, thereafter being subjectable to to a next step S11.

In step S11, the sealing doors 29 and 30 of the passage 22 are opened and then the treated wafer 1 is carried out of the chamber 2 through the passage 22 by means of carrying means(not shown) after a command is given thereto from the control unit 33. Thus, all the required treating steps at issue have been executed for one sheet of the semiconductor wafer 1. Subsequently, the same treatments are conducted for another sheet of wafer by repeating steps S1-S11 on the basis of the commands from the unit 33.

In the above embodiment, the surface treating apparatus for substrates are arranged such that the spinner 3 is provided on the spinning shaft 4 extending through the bottom of the chamber 2 as depicted in FIG. 1, that the semiconductor wafer 1 is spinned while being horizontally held on the spinner 3 with its main surface directed upward, that the surface treating liquids required are jetted toward the surface of the wafer from the nozzles 7 and 9 located upward of the wafer, and that the light sources 11 and 12 downwardly emit light to the wafer. On the contrary, the apparatus may be so constituted that the spinner be spinningly suspended from the top region of the chamber, that the semiconductor wafer be sandwiched, with its main surface directed down, by the spinner *per se* or suckingly held by a suction chuck associated with the spinner, that the surface treating liquids be upwardly spouted against the wafer from the respective nozzles positioned downward of the wafer, and that the light sources upwardly emit light to the wafer.

Furthermore, the complete entrance of the surface treating liquids 36 into the trenches 1a on the wafer 1 is effected by alternately rendering the inside of the chamber 2 at atmospheric pressure and reduced pressure in the surface treating steps in the above embodiment. However, such entrance can also be accomplished by alternately rendering the inside of the chamber at atmospheric pressure and increased pressure.

While the preferred embodiments of the present invention have been described above, it should be understood that various modifications may be made herein without departing the spirit of the invention and the scope of the appended claims.

What is claimed is:

1. A method for surface treating of a substrate having trenches formed on a surface thereof, comprising the steps of:

securing said substrate horizontally on spinning means and soinning said spinning means about a vertical axis in a chamber;

supplying a treating liquid to said trenched surface of the substrate during said spinning;

varying a pressure of the inside of said chamber from atmospheric pressure;

restoring said chamber pressure to atmospheric pressure; and repeating said liquid supplying and pressure varying and restoring steps a predetermined number of times to thereby promote introduction of said treating liquid into said trenches of said substrate.

2. The method as claimed in claim 1, comprising the additional step of:

emitting ultraviolet light to the trenched surface of the substrate, said ultraviolet light emitting step being conducted ahead of said liquid supplying step.

3. A method as claimed in claim 2, wherein:

said ultraviolet light is emitted to said trenched surface of said substrate before each performance of said liquid supplying step.

4. The method as claimed in claim 1, comprising the further steps of:

emitting ultraviolet light to the trench surface of the trenched substrate, said liquid supplying step being carried out together with said ultraviolet light emitting step.

5. The method as claimed in claim 1, wherein:

said varying step includes reducing the pressure inside of said chamber to a pressure lower than atmospheric pressure and, thereafter, restoring the chamber pressure to atmospheric pressure.

6. The method as claimed in claim 5, comprising the further step of:

heating and drying the substrate by emitting light to the trenched surface thereof, said heating and drying step being conducted together with said pressure reducing and restoring step.

7. The method as claimed in claim 1, wherein said pressure varying step includes increasing the pressure inside of the chamber to a higher than atmospheric pressure and, thereafter, restoring the same to atmospheric pressure.

8. The method as claimed in claim 1, comprising the additional step of:

heating and drying the substrate by emitting light to the surface thereof, said heating and drying step being conducted together with said pressure varying and restoring step.

9. A method as claimed in claim 1, wherein:

said spinning means is spun about said vertical axis before each performance of said liquid supplying step.

10. A method as recited in claim 1, wherein:

said spinning means is rotated at a predetermined speed after said repetition of liquid supplying and pressure varying and restoring steps.

11. A method as recited in claim 1, wherein:

said surface of said substrate is heated and dried after said repetition of liquid supplying and pressure varying and restoring steps.

12. An apparatus for providing surface treatment of a substrate having trenches formed on a surface thereof, comprising:
- a chamber;
- spinning means provided within said chamber for holding said substrate horizontally thereon and spinning said substrate about a vertical axis;
- nozzle means for supplying a treating liquid to said trenched surface of the substrate held on said spinning means; and
- means for varying a pressure in the inside of said chamber from and back to atmospheric pressure to thereby promote introduction of said treating liquid into said trenches of said substrate wherein said pressure varying means comprises means for supplying a selected gas at a controlled pressure to increase said chamber pressure to above atmospheric pressure.

13. The apparatus as claimed in claim 12, wherein: said pressure varying means includes means for reducing the pressure of the inside of said chamber, and a shield member in said chamber for shielding that portion of said chamber connected to said pressure reducing means and portions surrounding the same, which insertingly receives a spinning shaft of said spinning means, a portion of said chamber shielded by said shield member being formed to include a drain mouth communicated with said pressure reducing means.

14. The apparatus as claimed in claim 12, further comprising:
   a light source inside of said chamber for providing light for heating and drying of substrate held on said spinning means.

15. The apparatus as claimed in claim 12, further comprising:
   a light source outside of said chamber for providing light for heating and drying of the substrate held on said spinning means.

16. The apparatus as claimed in claim 12, further comprising:
   an ultraviolet light source inside of said chamber for emitting ultraviolet light toward said substrate held on said spinning means.

17. The apparatus as claimed in claim 12, further comprising:
   an ultraviolet light source outside of said chamber for emitting ultraviolet light toward said substrate held on said spinning means.

18. The apparatus as claimed in claim 12, wherein: said pressure varying means further comprises means for applying controlled suction to reduce said chamber pressure to below atmospheric pressure.

19. The apparatus for surface treating of substrates of claim 12, further comprising:
   trap means for separating out said liquid following its incidence onto said trenched substrate surface to which it was supplied, from any gas flow involved in varying said chamber pressure by said pressure varying means.

* * * * *